(12) United States Patent
Doerr

(10) Patent No.: US 7,733,923 B2
(45) Date of Patent: Jun. 8, 2010

(54) WIDE-BANDWIDTH MODE-LOCKED LASER

(75) Inventor: Christopher Richard Doerr, Middletown, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 186 days.

(21) Appl. No.: 11/296,996

(22) Filed: Dec. 8, 2005

(65) Prior Publication Data

US 2007/0133632 A1 Jun. 14, 2007

(51) Int. Cl.
*H01S 3/098* (2006.01)
(52) U.S. Cl. ....................................... 372/18
(58) Field of Classification Search .................. 372/18
See application file for complete search history.

(56) References Cited

U.S. PATENT DOCUMENTS

| | | | | |
|---|---|---|---|---|
| 4,890,893 | A * | 1/1990 | Smoot | 398/34 |
| 5,373,517 | A | 12/1994 | Dragone et al. | 372/20 |
| 6,031,851 | A | 2/2000 | Shimizu et al. | 372/18 |
| 6,031,859 | A | 2/2000 | Nambu | 372/50 |
| 6,137,604 | A * | 10/2000 | Bergano | 398/1 |
| 6,285,477 | B1 * | 9/2001 | Miyazaki et al. | 398/9 |
| 6,385,216 | B1 | 5/2002 | Chang et al. | 372/6 |
| 6,434,175 | B1 * | 8/2002 | Zah | 372/20 |
| 6,603,898 | B2 * | 8/2003 | Doerr | 385/24 |
| 6,738,408 | B2 | 5/2004 | Abedin | 372/94 |
| 6,850,543 | B2 | 2/2005 | Cundiff et al. | 372/18 |
| 6,868,098 | B1 | 3/2005 | Piché et al. | 372/18 |
| 7,123,402 | B1 | 10/2006 | Doerr et al. | 359/326 |
| 2002/0191249 | A1 * | 12/2002 | Orbach et al. | 359/127 |

OTHER PUBLICATIONS

Bente et al., "Simulation of semiconductor mode-locked ring lasers with monolithically integrated passive pulse shaping elements", Sep. 19, 2005, IEEE Proceedings of the 5th International Conference on Numerical Simulation of Optoelectronic Devices, 107-108.*

(Continued)

*Primary Examiner*—Minsun Harvey
*Assistant Examiner*—Joshua King
(74) *Attorney, Agent, or Firm*—Mendelsohn, Drucker & Associates, P.C.; Yuri Gruzdkov; Steve Mendelsohn

(57) ABSTRACT

A mode-locked laser that has an optical cavity containing multiple optical amplifiers, each dedicated to a respective spectral portion of an optical signal generated by the laser, wherein the dispersion effects are managed by utilizing a separate intra-cavity phase tuner for each such spectral portion and/or by having appropriately configured waveguides corresponding to different spectral portions. Advantageously, a relatively wide combined gain spectrum provided by the optical amplifiers and the intra-cavity dispersion compensation provided by the phase tuners and/or waveguides enable this laser to realize a mode-locking regime that results in the emission of an optical pulse train having a relatively wide frequency spectrum. In one embodiment, the optical cavity of the mode-locked laser has a perfectly spectrally sampled arrayed waveguide grating (AWG) that is configured to divide the optical signal into the spectral portions and apply these portions to the respective waveguides, optical amplifiers, and phase tuners.

22 Claims, 5 Drawing Sheets

OTHER PUBLICATIONS

Smit M.K., "InP Photonic Integrated Circuits", Nov. 10-14, 2002, IEEE Proc. IEEE/LEOS Annual Meeting Conference 2002, 843-844.*

Doerr et al., "Integrated Band Demultiplexer Using Waveguide Grating Routers", Aug. 2003, IEEE Photonics Technology Letters, vol. 15 No. 8, 1088-1090.*

Bente et al., "Simulation of semiconductor mode-locked ring lasers with monolithically integrated passive pulse shaping elements", Sep. 19, 2005, IEEE Proceedings of the 5th International Conference on Numerical Simulation of Optoelectronic Devices, 107-108.*

Smit M.K., "InP Photonic Integrated Circuits", Nov. 10-14, 2002, IEEE Proc. IEEE/LEOS Annual Meeting Conference 2002, 843-844.*

Doerr et al., "Integrated Band Demultiplexer Using Waveguide Grating Routers", Aug. 2003, IEEE Photonics Technology Letters, vol. 15 No. 8, 1088-1090.*

Heck et al., "Simulation and Design of Integrated Pulse Shaping Components for Femtosecond Modelocked Ring Lasers", 2005, ECIO'05: 12th European Conference on Integrated Optics.*

Bente et al., "Simulation of semiconductor mode-locked ring lasers with monolithically integrated passive pulse shaping elements", Sep. 19, 2005, IEEE Proceedings of the 5th International Conference on Numerical Simulation of Optoelectronic Devices, 107-108.*

Smit M.K., "InP Photonic Integrated Circuits", Nov. 10-14, 2002, IEEE Proc. IEEE/LEOS Annual Meeting Conference 2002, 843-844.*

Doerr et al., "Integrated Band Demultiplexer Using Waveguide Grating Routers", Aug. 2003, IEEE Photonics Technology Letters, vol. 15 No. 8, 1088-1090.*

Heck et al., "Simulation and Design of Integrated Pulse Shaping Components for Femtosecond Modelocked Ring Lasers", 2005, ECIO'05: 12th European Conference on Integrated Optics.*

"Simulation and Design of Integrated Pulse Shaping Components for Femtosecond Modelocked Ring Lasers," by M.J.R. Heck, P. Munoz, E.A.J.M. Bente, et al., published in the Proceedings of the 12th European Conference on Integrated Optics (2005, ECIO'05).

"Dispersion-Managed Breathing-Mode Semiconductor Mode-Locked Ring Laser: Experimental Characterization and Numerical Simulations," by B. Resan and P.J. Delfyett, IEEE Journal of Quantum Electronics, 2004, vol. 40, No. 3, pp. 214-221.

"Integrated Band Demultiplexer Using Waveguide Grating Routers," by C.R. Doerr, R. Pafcheck, and L.W. Stulz, IEEE Photonics Technology Letters, 2003, vol. 15, No. 8, pp. 1088-1090.

"Dynamic Wavelength Equalizer in Silica Using the Single-Filtered-Arm Interferometer," by C.R. Doerr, IEEE Photonics Technology Letters, vol. 11, No. 5, May 1999, pp. 581-583.

"Simulation of semiconductor mode-locked ring lasers with monolithically integrated passive pulse shaping elements" by E.A.J.M. Bente et al.; NUOSD;'05; Sep. 2005; XP10843754A.

"Simultaneous WDM and Broadcast Transmission Using a Single Multiwavelength Waveguide-Grating-Router Laser" by P.P. Iannone et al.; IEEE Photonics Technology Letters, vol. 8, No. 10, Oct. 1996, XP11048373A.

* cited by examiner

WIDE-BANDWIDTH MODE-LOCKED LASER

BACKGROUND OF THE INVENTION

1. Field of the Invention

The present invention relates to optical communication equipment and, more specifically, to optical sources used in optical communication systems.

2. Description of the Related Art

Modern optical communication systems transmit information between communication nodes using wavelength division multiplexed (WDM) signals. The generation of WDM signals in such systems relies on light sources capable of producing electromagnetic radiation at appropriate multiple wavelengths (frequencies). One such light source is a semiconductor mode-locked (ML) laser, which owes its utility to its relatively small size, high power, low noise, and low cost. However, a general problem with prior-art semiconductor ML lasers is that a typical range of wavelengths (spectral bandwidth) provided by such lasers is relatively narrow, e.g., about 20 nm.

SUMMARY OF THE INVENTION

Problems in the prior art are addressed, in accordance with the principles of the present invention, by a mode-locked laser that has an optical cavity containing (i) multiple optical amplifiers, each dedicated to a respective spectral portion of an optical signal generated by the laser, (ii) means for managing intra-cavity dispersion effects, and (iii) a loss-modulating element. The optical cavity dispersion effects can be managed by utilizing a separate intra-cavity phase tuner for each such spectral portion and/or by having appropriately configured waveguides corresponding to different spectral portions. Advantageously, a relatively wide combined gain spectrum provided by the optical amplifiers and the intra-cavity dispersion compensation provided by the phase tuners and/or waveguides enable this laser to realize a mode-locking regime that results in the emission of an optical pulse train having a relatively wide (e.g., octave-spanning) frequency spectrum.

In one embodiment, the optical cavity of a mode-locked laser of the invention has a perfectly spectrally sampled arrayed waveguide grating (AWG) having a plurality of overlapping optical passbands. For each passband, the optical cavity has a dedicated optical amplifier serially connected with a dedicated phase tuner. Each optical amplifier is adapted to provide optical gain for the respective optical passband, and the respective phase tuner is adapted to substantially provide dispersion compensation within that optical passband. The optical cavity further has a modulating element coupled to the AWG and adapted to modulate optical losses in the cavity such that an optical pulse train is emitted.

DETAILED DESCRIPTION

Figure 1A:
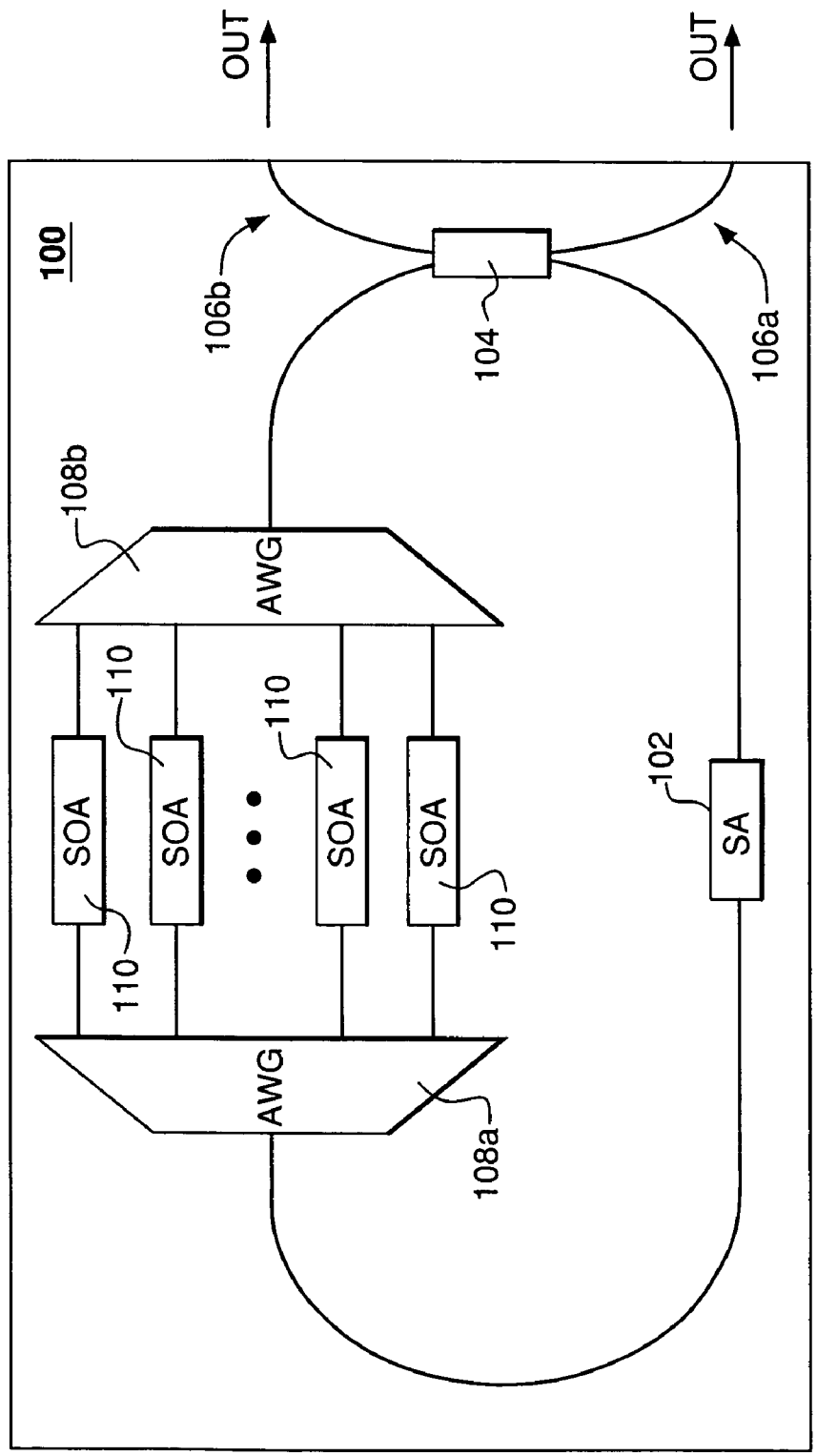
FIGS. 1A-B illustrate a representative prior-art mode-locked (ML) laser.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Mode locking is a method of obtaining ultra-short optical pulses from a laser that is called a mode-locked (ML) laser. The optical cavity of an ML laser contains an active modulating element (e.g., an optical modulator) or a nonlinear passive modulating element (e.g., a saturable absorber) or both, which causes formation of one or more ultra-short pulses circulating in the laser cavity. Each time a circulating pulse hits the output coupler (e.g., a partially transparent mirror), light is emitted from the laser, thereby producing an optical pulse train. The pulse-repetition rate in the pulse train (typically in the gigahertz range) is determined by the cavity round-trip time and the number of pulses in the cavity. The duration of each pulse in the pulse train is determined by the characteristics of the optical modulator and/or saturable absorber and typically falls into the femtosecond to picosecond time range.

Active mode locking (e.g., using an acousto-optic or electro-optic modulator, a Mach-Zehnder integrated-optic modulator, or a semiconductor electro-absorption modulator) produces optical pulses that are in synchronism with the signal that drives the modulator. To achieve stable operation, an integer multiple of the period of the driving signal is designed to substantially match the round-trip time in the cavity in order to avoid a strong timing jitter or even chaotic lasing behavior, which might result if there is a significant mismatch between these two parameters.

Passive mode locking with a saturable absorber generally results in much shorter optical pulses compared to those obtained with active mode locking, because a passive saturable absorber can modulate cavity losses much faster than an active optical modulator, provided that the saturable absorber has a sufficiently small recovery time. Furthermore, a pulse duration even shorter than the recovery time of the saturable absorber can be achieved if certain design guidelines are observed. Saturable absorbers for passive mode locking can be real absorber devices or artificial saturable absorbers, e.g., those based on Kerr-lens mode locking or additive-pulse mode locking.

Hybrid mode locking typically involves some combination of active and passive mode locking and is typically used in monolithic semiconductor lasers. Although hybrid mode locking adds complexity to the overall laser structure, it provides flexibility in achieving the desired laser characteristics and offers the advantages and benefits of both active and passive mode locking techniques.

The optical spectrum of a pulse train produced by an ML laser is composed of discrete spectral lines separated from one another by a constant frequency interval substantially equal to the pulse repetition rate. As such, the optical spectrum of an ML laser is often referred to as a spectral frequency comb. The total spectral width of a frequency comb is determined by the gain spectrum and the effects of intra-cavity dispersion and nonlinearities. For example, resonant frequencies of the cavity modes are usually not exactly equidistant due to the effects of dispersion, e.g. in the optical gain medium. However, the mode-locking mechanism forces the laser to emit frequencies that can to some extent deviate from these resonant frequencies while being equidistant. Still, the frequency deviations may not be arbitrarily high, and one can obtain broadband spectra only if the effective intra-cavity dispersion is sufficiently small, so that the resonant frequencies are substantially equidistant and sufficiently close to the corresponding comb frequencies. In the time domain, this condition can be understood via the temporal broadening of pulses caused by dispersion, which is substantially compensated by the mode-locking mechanism. Optical nonlinearities play an important role because they affect the temporal broadening and, as such, affect the relationship between resonant and comb frequencies.

Figure 1B:
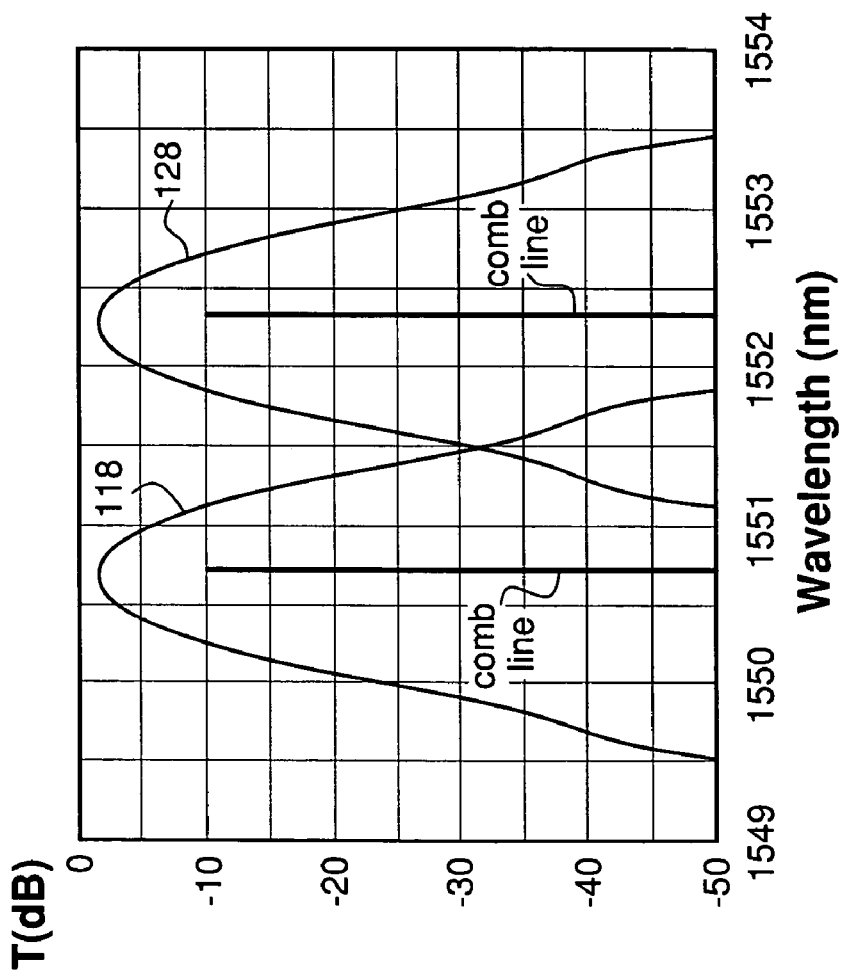

FIGS. 1A-B illustrate a representative prior-art ML laser 100 disclosed in an article by M. J. R. Heck, P. Munoz, E. A. J. M. Bente, et al., "Simulation and Design of Integrated Pulse Shaping Components for Femtosecond Modelocked Ring Lasers," published in the Proceedings of the 12$^{th}$ European Conference on Integrated Optics (2005, ECIO'05), the teachings of which article are incorporated herein by reference. More specifically, FIG. 1A is a circuit diagram of laser 100, and FIG. 1B graphically shows passband characteristics of arrayed waveguide gratings (AWGs) 108a-b used in that laser. Laser 100 represents a prior-art attempt to increase the laser bandwidth by partitioning the emission spectrum and providing a separate gain element for each spectral portion.

Referring to FIG. 1A, laser 100 is a ring-cavity laser that operates using passive mode locking implemented with a saturable absorber (SA) 102 inserted into the ring cavity. Optical pulses can circulate in the ring cavity of laser 100 in both clockwise and counterclockwise directions. The clockwise-circulating pulses are coupled, via an output coupler 104, into an output waveguide 106a. The counterclockwise-circulating pulses are similarly coupled into an output waveguide 106b.

The gain medium of laser 100 includes a plurality of semiconductor optical amplifiers (SOAs) 110 that are placed between two AWGs 108a-b. One purpose of having AWGs 108a-b is to realize a so-called "breathing mode" configuration, in which the optical pulse is stretched before entering the SOAs, and recompressed afterwards. For example, for the clockwise-circulating pulses, the stretching is achieved because each passband of AWG 108a limits the spectral bandwidth corresponding to the respective SOA 110 and therefore increases the pulse width in that SOA. The amplified signals from different SOAs 110 are recombined in AWG 108b, where these signals interfere such that the resulting combined signal contains relatively narrow, compressed pulses. More details on the breathing mode configuration can be found, e.g., an article by B. Resan and P. J. Delfyett, "Dispersion-Managed Breathing-Mode Semiconductor Mode-Locked Ring Laser: Experimental Characterization and Numerical Simulations," published in IEEE Journal of Quantum Electronics, 2004, vol. 40, No. 3, pp. 214-221, the teachings of which are incorporated herein by reference.

FIG. 1B shows transmission characteristics of two adjacent passbands 118 and 128 in AWG 108. Each of passbands 118 and 128 has a substantially Gaussian shape, with spectral separation between the center frequencies of the Gaussians being about 200 GHz. Other passbands (not shown in FIG. 1B) of AWG 108 are similarly placed on a 200-GHz grid and have transmission characteristics similar to those of passbands 118 and 128. Note that the point of intersection of passbands 118 and 128 has an attenuation value of about 30 dB. As a result, the overall transmission spectrum of AWG 108 has deep nulls, each located about halfway between the center frequencies of adjacent Gaussians. One consequence of this transmission spectrum is that laser 100 can support, via cavity mode selection, only one frequency-comb line per passband, as indicated by the vertical solid lines in FIG. 1B. As a result, to achieve stable modelocking, laser 100 should have a fixed relationship between the passband spacing and the cavity length. More specifically, in a preferred configuration, the passband spacing in laser 100 is an integer multiple of the cavity length (when the latter is expressed Hz). For example, for the passband spacing of 200 GHz, an acceptable cavity length is 40 GHz, which leads to five laser pulses circulating in the cavity in each direction.

One problem with laser 100 is that the laser structure is highly dispersive due to self-phase modulation in SOAs 110, which leads to different effective optical-path lengths for the optical signals traveling through different SOAs. As a result, only a relatively narrow regime of mode locking is available for laser 100. In addition, the self-phase modulation limits the attainable pulse duration and additional extra-cavity dispersion-compensating elements are employed to produce femtosecond pulses. A representative extra-cavity dispersion compensator may include an additional pair of AWGs, with multiple phase modulators coupled between these AWGs. The addition of these extra-cavity dispersion-compensating elements can significantly complicate the overall laser structure but nevertheless does not improve the regime of mode locking for laser 100, which remains relatively narrow.

Figure 2A:
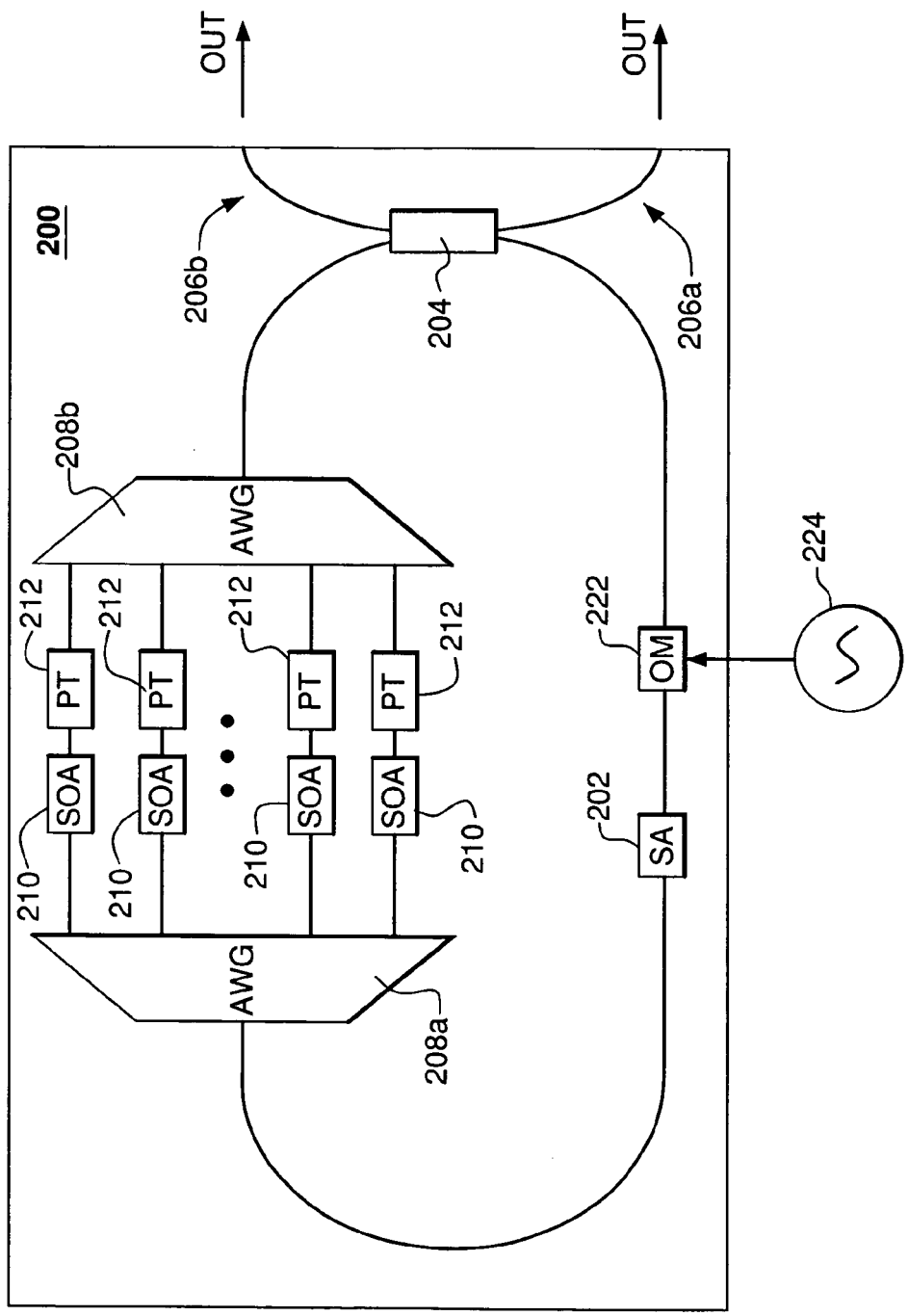
FIGS. 2A-B illustrate an ML laser according to one embodiment of the invention.
Figure 2B:
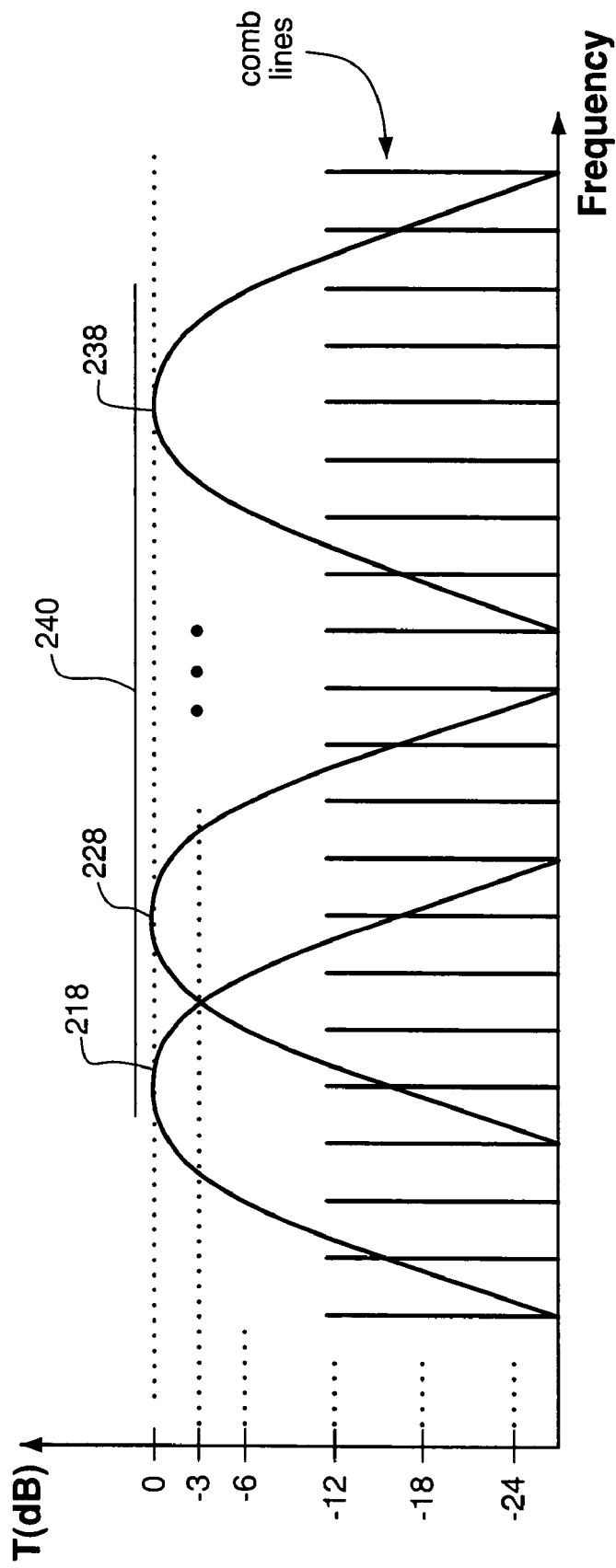

FIGS. 2A-B illustrate an ML laser 200 according to one embodiment of the invention. More specifically, FIG. 2A is a circuit diagram of laser 200, and FIG. 2B graphically shows passband characteristics of AWGs 208a-b used in that laser. As will be apparent from the description below, laser 200 can advantageously have a relatively wide (e.g., octave-spanning) spectral bandwidth, while being very flexible with respect to establishing desirable regimes of mode locking.

Referring to FIG. 2A, laser 200 is a ring-cavity laser that operates using hybrid mode locking implemented with a saturable absorber (SA) 202 and an optical modulator (OM) 222 located within the ring cavity. OM 222 is configured to be driven with a driver 224, which provides an appropriate driving signal corresponding to the cavity length of laser 200. In one embodiment, saturable absorber 202 can be omitted from the laser cavity to implement purely active mode locking. In another embodiment, optical modulator 222 can similarly be omitted from the laser cavity to implement purely passive mode locking. Laser 200 can be designed to have a relatively short cavity length to support a relatively high pulse-repetition rate (e.g., 10 GHz) and produce appropriately spaced frequency comb lines suitable for desirably high data transmission rates.

Optical pulses can circulate in the ring cavity of laser 200 in both clockwise and counterclockwise directions. The clockwise-circulating pulses are coupled, via an output coupler 204, into an output waveguide 206a. The counterclockwise-circulating pulses are similarly coupled into an output waveguide 206b. In one embodiment, a directional optical isolator (not shown in FIG. 2A) can be used to suppress either the clockwise- or counterclockwise-circulating pulses, in which case the corresponding one of waveguides 206a-b can be omitted from the laser structure.

Similar to laser 100 (FIG. 1), laser 200 realizes a breathing mode configuration. More specifically, for the clockwise-circulating pulses, pulse stretching is achieved due to the passband filtering in AWG 208a, and pulse compression is achieved by the spectral component recombination in AWG 208b. For the counterclockwise-circulating pulses, pulse stretching and compression are similarly achieved, with the roles of AWGs 208a-b reversed compared to those played with respect to the clockwise-circulating pulses.

FIG. 2B shows transmission characteristics of AWG 208 according to one embodiment of the invention. The passbands of AWG 208, only three of which (218, 228, and 238) are shown in FIG. 2B, are designed such that the overall transmission spectrum of the AWG is substantially flat and ripple free, e.g., as indicated by a solid line 240. For example, the passband shapes in AWG 208 are such that the point of intersection of two adjacent passbands, e.g., passbands 218 and 228, has an attenuation value of about 3 dB. As such, AWG 208 differs significantly from AWG 108 (FIG. 1), e.g., because AWG 208 does not have relatively deep transmission nulls located between adjacent passbands. One consequence of the relatively flat transmission spectrum of AWGs 208a-b is that laser 200 can support multiple comb lines per passband, as indicated by the vertical solid lines in FIG. 2B, wherein at least some and possibly all comb lines are shared between different adjacent passbands. AWGs similar to AWGs 208a-b are sometimes referred to as "highly spectrally sampled" AWGs. The amount of sampling that allows a substantially perfectly flat spectrum is called perfect spectral sampling. The spectrum remains substantially perfectly flat as the sampling is increased beyond that amount. Several examples of perfectly spectrally sampled AWGs, including waveguide-circuit implementations thereof, can be found, e.g., in U.S. Pat. No. 6,603,898 and an article by C. R. Doerr, R. Pafcheck, and L. W. Stulz "Integrated Band Demultiplexer Using Waveguide Grating Routers," published in IEEE Photonics Technology Letters, 2003, vol. 15, No. 8, pp. 1088-1090, the teachings of both of which are incorporated herein by reference. To briefly summarize those teachings, if the output waveguides of the AWG are spaced by b micron, then the angular aperture occupied by the grating areas should be less than $\lambda/b$ (where $\lambda$ is the wavelength) to have perfect or higher than perfect spectral sampling.

AWGs 208a-b enable laser 200 to perform one or more of at least the following three functions:

1. Artificial gain broadening. Different spectral portions of the optical signal have their own gain reservoirs in the form of respective dedicated SOAs 210 coupled to the corresponding ports of AWGs 208a-b. The spectral shape of the gain is controllable via appropriate configuration of different SOAs 210 so as to allow artificial broadening of the overall gain spectrum and an increase in the number of comb lines.

2. Dispersion compensation. Splitting of the spectrum into narrower spectral portions enables independent spectral phase matching using different dedicated phase tuners (PTs) 212 located between the corresponding ports of AWGs 208a-b. As explained above, self-phase modulation in the SOAs produces signal dispersion, the amount of which is different for each passband. Also, the material and waveguide characteristics produce additional dispersion. Each dedicated phase tuner 212 provides dispersion compensation for the corresponding passband, while all phase tuners 212 together provide effective dispersion compensation over the full bandwidth of laser 200. Advantageously over laser 100 (FIG. 1), intra-cavity dispersion compensation of laser 200 combined with the relatively wide gain profile enables this laser to have relatively flexible and widely adjustable regimes of mode locking.

3. Nonlinearity reduction in the SOAs. As already mentioned above, passband filtering in AWGs 208a,b stretches the optical pulses that enter each individual SOA 210 and, therefore, reduces the adverse effects of nonlinearities experienced by an optical pulse in each respective SOA. This nonlinearity suppression advantageously improves pulse-train characteristics.

In one embodiment, the waveguides connecting the corresponding ports of AWGs 208a-b are designed to have substantially equal optical lengths. This waveguide configuration helps to achieve proper mode locking because different spectral portions corresponding to different passbands of the AWGs experience the same effective cavity length. Accordingly, in this embodiment, phase tuners 212 are designed to have a relatively wide phase-tuning range to provide an appropriate amount of dispersion compensation for the corresponding spectral components of the optical signal.

This embodiment of laser 200 is different from laser 100 because laser 100 can be mode-locked even with relatively large optical path-length differences due to the fact that it only has one cavity-mode line per passband (see FIG. 1B). As such, laser 100 (FIG. 1) does not have substantially equal optical waveguide lengths, nor does it have waveguide length differences chosen based on intra-cavity dispersion effects. In contrast, with multiple cavity-mode lines per passband, as in laser 200 (see FIG. 2B), in order to achieve mode locking, the intra-cavity dispersion effects are managed using relatively small and/or specific optical pass-length differences between different spectral components.

In another embodiment, the waveguides connecting the corresponding ports of AWGs 208a-b are designed to have different optical lengths, with the length difference related to the amount of intra-cavity dispersion corresponding to different passbands. This embodiment enables the use of phase tuners 212 that have a relatively narrow phase-tuning range because (i) the waveguide length differences serve to provide fixed phase shifts between the corresponding spectral components of the optical signal and (ii) for each passband, a combination of the fixed phase shift due to the waveguide length difference and the adjustable phase shift added in the respective phase tuner 212 provides an appropriate amount of dispersion compensation.

In yet another embodiment, laser 200 is designed to produce a spectrally fixed set of comb lines, i.e., is not tunable. In this particular embodiment, at least some and possibly all phase tuners 212 can be omitted from the laser structure. Instead, the waveguides connecting the corresponding ports of AWGs 208a-b are designed to have the waveguide length differences that provide appropriate relative phase shifts between the corresponding spectral components of the optical signal, with the net effect of substantially providing dispersion compensation for the optical signal generated by the laser. For example, in one configuration, the waveguide length difference between any two waveguides is substantially equal to the difference in the amounts of dispersion times the wavelength difference between the respective passbands times the group velocity in the cavity.

Figure 3:
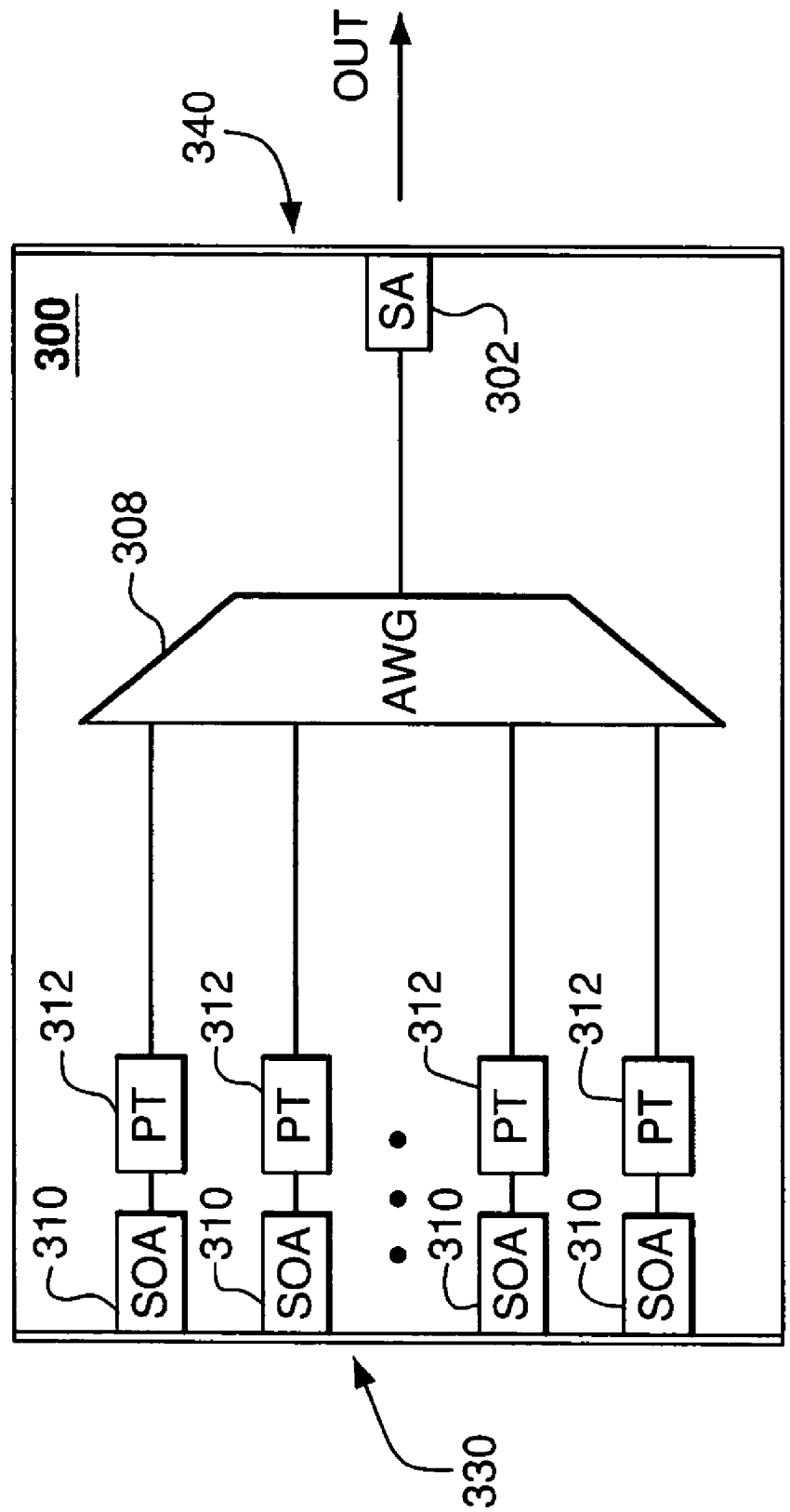
FIG. 3 shows an ML laser according to another embodiment of the invention.

FIG. 3 shows an ML laser 300 according to another embodiment of the invention. Laser 300 is generally analogous to laser 200 of FIG. 2, with analogous elements of the two lasers designated with the labels having the same last two digits. However, one difference between lasers 200 and 300 is that the latter has a "linear" cavity, as opposed to the ring cavity in the former. More specifically, the cavity of laser 300 is defined by two mirrors, i.e., a highly reflective mirror 330 and a partially transparent mirror 340. In one embodiment, mirrors 330 and 340 are formed by appropriately coating the cleaved edges of the semiconductor wafer in which the structure of laser 300 is fabricated. Although, laser 300 is shown as implemented with passive mode locking, one skilled in the art will appreciate that this laser can also be implemented with active or hybrid mode locking.

Due to the linear cavity of laser 300, AWG 308 is traversed two times during each round trip in the cavity. For example, an optical pulse reflected by mirror 340 passes through SA 302 and traverses AWG 308 for a first time. At that point, AWG 308 in laser 300 performs a function analogous to that performed by AWG 208a in laser 200 with respect to clockwise-circulating pulses. Each spectral component of the pulse produced by AWG 308 then traverses its respective PT 312 and SOA 310, is reflected by mirror 330, traverses the SOA 310 and PT 312 again, and reenters AWG 308. At this point, AWG 308 performs a function analogous to that performed by AWG 208b with respect to the clockwise-circulating pulses. The recombined spectral components form a pulse, which traverses SA 302 and reaches mirror 340, thereby completing a round trip in the laser cavity. Note that, in laser 300, an optical pulse passes through each SOA 310 and each phase tuner 312 twice per round trip versus once for each SOA 210 and each phase tuner 212 in laser 200. As such, SOAs 310 and phase tuners 312 can be designed to have lower amplification and phase-tuning ranges, respectively, than SOAs 210 and phase tuners 212.

Either one of lasers 200 and 300 can be configured to function as a mode-locked laser with a controlled carrier-envelope offset (CEO) phase, e.g., similar to a mode-locked laser described in U.S. Pat. No. 6,850,543, the teachings of which are incorporated herein by reference. Briefly, a mode-locked laser with CEO phase control is designed to produce a train of ultra-short pulses, each having a duration corresponding to several (e.g., less than 10) oscillation periods of the electromagnetic carrier wave. At such short durations, the relative phase offset between the pulse envelope and the carrier wave affects the spectral positions of the lines in the frequency comb produced by the laser. One characteristic of a mode-locked laser with CEO phase control is that it enables reliable control of the phase offset such that the frequency comb can be aligned with respect to a fixed frequency grid.

Pulse-to-pulse phase evolution in the pulse train generated by a mode-locked laser with CEO phase control is primarily due to the fact that the group and phase velocities differ inside the mode-locked laser cavity. Lasers 200 and 300 enable independent and accurate control of the group and phase velocities in the laser cavity and, therefore, controllable tunability of the spectral position of the frequency comb produced by the laser. For example, in laser 300, to adjust the round-trip group delay in the cavity, one adjusts all phase tuners 312 by the same amount. To adjust the round-trip group velocity dispersion in the cavity, one then adjusts each phase tuner 312 by an appropriate amount that increases (decreases) in a linear fashion from one phase tuner to the next phase tuner.

Each of lasers 200 and 300 can be implemented as a monolithic structure manufactured, as known in the art, using a single wafer. Representative manufacturing steps that can be used in the manufacturing process of lasers 200 and 300 are described, e.g., in the above-cited '898 patent and U.S. Pat. Nos. 5,373,517, 6,031,859, and 6,031,851, the teachings of all of which are incorporated herein by reference. Both conventional semiconductor materials, e.g., InP/InGaAsP, and quantum-dot materials can be utilized in the fabrication process.

While this invention has been described with reference to illustrative embodiments, this description is not intended to be construed in a limiting sense. Although embodiments of the invention have been described in reference to AWGs, they can similarly be implemented with any suitable optical switch fabric(s) (OSFs). Various modifications of the described embodiments, as well as other embodiments of the invention, which are apparent to persons skilled in the art to which the invention pertains are deemed to lie within the principle and scope of the invention as expressed in the following claims.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

What is claimed is:

1. A laser having an optical cavity, comprising:
   an optical amplification device capable of individually amplifying each of a plurality of spectral components of a laser signal;
   a dispersion manager adapted to substantially provide intra-cavity dispersion compensation for the laser signal;
   a loss modulating element optically coupled to the optical amplification device and the dispersion manager, wherein the optical amplification and the loss modulation create conditions for an optical pulse train to be emitted from the cavity; and
   a first optical switch fabric (OSF) characterized by a plurality of passbands and adapted to partition the laser signal into said plurality of spectral components, wherein:
      each spectral component corresponds to a respective passband of said first OSF; and
      a combined transmission spectrum of the passbands has substantially constant transmission from about the center of a first passband to about the center of a last passband of a spectral range.

2. The invention of claim 1, wherein the cavity is a ring cavity, wherein the cavity further comprises a second OSF adapted to recombine the spectral components, wherein:
   the modulating element is optically coupled to the second OSF;
   the first OSF and the second OSF are optically coupled via a plurality of optical paths; and
   each optical passband of the second OSF matches a respective optical passband of the first OSF.

3. The invention of claim 1, wherein:
   the first OSF comprises an arrayed waveguide grating (AWG) having a first port and a plurality of second ports, wherein each second port is optically coupled to the first port to form a respective optical passband of said AWG;
   the laser comprises a plurality of optical paths, each optical path having a waveguide coupled to a respective second port of the AWG; and
   the optical amplification device comprises a plurality of optical amplifiers, each coupled to a respective waveguide.

4. The invention of claim 3, wherein the dispersion manager comprises a plurality of phase tuners, each coupled to a respective waveguide and a respective optical amplifier.

5. The invention of claim 4, wherein the waveguides corresponding to different optical paths have substantially equal optical lengths.

6. The invention of claim 3, wherein the cavity is defined by first and second mirrors, wherein:
   the first mirror is optically coupled to a side of the AWG having the first port;
   the second mirror is optically coupled to a side of the AWG having the plurality of second ports; and
   the first mirror is a partially transparent mirror adapted to enable the optical pulse train emission from the cavity.

7. The invention of claim 3, wherein spectral shape of the passbands is such that a point of intersection of two adjacent passbands has an attenuation value of about 3 dB.

8. The invention of claim 3, wherein:
   the waveguides corresponding to different optical paths have different optical lengths;

a length difference between any two waveguides is a function of difference in amounts of dispersion between the respective two spectral components; and the length differences between the waveguides serve to substantially provide the intra-cavity dispersion compensation.

9. The invention of claim 8, wherein the length difference between any two waveguides is substantially equal to the difference in the amounts of dispersion in the respective optical paths times the wavelength difference between the respective passbands times the group velocity in the cavity.

10. The invention of claim 1, wherein frequency spectrum of the optical pulse train has two or more frequency comb lines per passband.

11. The invention of claim 10, wherein at least one frequency comb line is shared between two adjacent passbands.

12. The invention of claim 1, wherein the laser is implemented as an integrated waveguide circuit.

13. A method of generating pulsed light, comprising:
individually amplifying each of a plurality of spectral components of a laser signal propagating in an optical cavity;
substantially providing intra-cavity dispersion compensation for the laser signal;
modulating optical losses in the cavity such that the optical amplification and the loss modulation create conditions for an optical pulse train to be emitted from the cavity; and
partitioning the laser signal into the plurality of spectral components, wherein:
each spectral component corresponds to a respective passband of said plurality of passbands; and
a combined transmission spectrum of the passbands has substantially constant transmission from about the center of a first passband to about the center of a last passband of a spectral range.

14. The invention of claim 13, wherein the step of substantially providing comprises adjusting the optical phase of each spectral component using a respective optical path of said spectral component, wherein the optical paths corresponding to different spectral components are adapted to substantially provide the intra-cavity dispersion compensation.

15. The invention of claim 13, wherein the step of partitioning is performed using a first arrayed waveguide grating (AWG).

16. The invention of claim 15, comprising recombining the spectral components, wherein:
the step of recombining is performed using a second AWG; and
each optical passband of the second AWG matches a respective optical passband of the first AWG.

17. The invention of claim 15, wherein spectral shape of the passbands is such that a point of intersection of two adjacent passbands has an attenuation value of about 3 dB.

18. The invention of claim 13, wherein:
frequency spectrum of the optical pulse train has two or more frequency comb lines per passband; and
at least one frequency comb line is shared between two adjacent passbands.

19. A device, comprising:
means for individually amplifying each of a plurality of spectral components of a laser signal propagating in an optical cavity;
means for substantially providing intra-cavity dispersion compensation for the laser signal;
means for modulating optical losses in the cavity such that the optical amplification and the loss modulation create conditions for an optical pulse train to be emitted from the cavity; and
means for partitioning the laser signal into the plurality of spectral components, wherein:
each spectral component corresponds to a respective passband of said plurality of passbands; and
a combined transmission spectrum of the passbands has substantially constant transmission from about the center of a first passband to about the center of a last passband of a spectral range.

20. The invention of claim 19, further comprising:
means for recombining the spectral components.

21. The invention of claim 19, wherein frequency spectrum of the optical pulse train has two or more frequency comb lines per passband.

22. The invention of claim 21, wherein at least one frequency comb line is shared between two adjacent passbands.

* * * * *